United States Patent
Taft et al.

(10) Patent No.: US 7,046,179 B1
(45) Date of Patent: May 16, 2006

(54) APPARATUS AND METHOD FOR ON-CHIP ADC CALIBRATION

(75) Inventors: Robert C. Taft, Munich (DE); Christopher A. Menkus, Munich (DE); Maria R. Tursi, Munich (DE); Ols Hidri, Munich (DE); Andreas Tuechler, Boeblingen (DE); Valerie Pons, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/817,322

(22) Filed: Mar. 30, 2004

Related U.S. Application Data

(60) Provisional application No. 60/544,660, filed on Feb. 13, 2004.

(51) Int. Cl.
*H03M 1/10* (2006.01)

(52) U.S. Cl. .................................. 341/120; 341/118
(58) Field of Classification Search ............. 341/120, 341/118, 172, 155, 159, 144
See application file for complete search history.

(56) References Cited

U.S. PATENT DOCUMENTS

| | | | |
|---|---|---|---|
| 6,072,416 A | 6/2000 | Shima | |
| 6,100,836 A | 8/2000 | Bult | |
| 6,369,732 B1 | 4/2002 | Liu et al. | |
| 6,473,021 B1 * | 10/2002 | Somayajula et al. | 341/172 |
| 6,617,994 B1 * | 9/2003 | Heim et al. | 341/172 |
| 6,707,403 B1 * | 3/2004 | Hurrell | 341/120 |
| 2004/0075599 A1 * | 4/2004 | Jonsson et al. | 341/120 |

OTHER PUBLICATIONS

Taft, Robert et al. Feb. 17, 2004. "High-Speed A/D Converters." IEEE International Solid-State Circuits Conference: Session 14: pp. 252-253.

* cited by examiner

*Primary Examiner*—Peguy JeanPierre
*Assistant Examiner*—Joseph Lauture
(74) *Attorney, Agent, or Firm*—Darby & Darby PC; Matthew M. Gaffney

(57) ABSTRACT

An ADC circuit includes a multiplexer, a calibration circuit, one or more ADC banks, and a calibration ladder, all on an integrated circuit. The calibration resistor ladder is enabled during a calibration phase, and disabled during normal operation. When enabled, the calibration resistor ladder provides a calibration reference signal. Also, the multiplexer provides the calibration reference signal to one or more ADC banks during a calibration phase, and provides an analog input signal to the ADC banks otherwise. The calibration circuit is arranged to provide one or more adjustment signals to the ADC banks to calibrate the ADC banks in response to one or more comparator output signals from the ADC banks.

26 Claims, 10 Drawing Sheets

APPARATUS AND METHOD FOR ON-CHIP ADC CALIBRATION

RELATED APPLICATION

This application claims the benefit of U.S. Provisional Application No. 60/544,660 filed Feb. 13, 2004, the benefit of the earlier filing date of which is hereby claimed under 35 U.S.C. § 119 (e).

FIELD OF THE INVENTION

The invention is related to analog-to-digital conversion, and in particular, to an apparatus and method for calibrating a folding or flash analog-to-digital converter with an on-chip resistor ladder.

BACKGROUND OF THE INVENTION

An analog-to-digital converter (ADC) is employed to change/convert an analog input signal into a digital output signal. There are several different types of ADCs in current use, including pipeline, flash, and folding. For pipeline ADCs, separate decoding stages are arranged in a pipeline to convert the analog signal into a digital signal.

In a flash ADC, k bits of resolution employ $2^k$ comparators to convert an analog signal into a digital signal. Folding ADCs are a variation of a typical flash ADC architecture except that they are arranged to map the analog input signal range into N regions where each of these N regions share the same comparators. In a folding ADC, the total number of comparators is typically $2^k/N$. Also, a folding ADC includes a coarse channel for determining from which of the N input regions the analog input signal originated. Usually, the coarse channel is configured to use coarse reference voltages that are spaced according to the voltage spacing between each folded region.

BRIEF DESCRIPTION OF THE DRAWINGS

Non-limiting and non-exhaustive embodiments of the present invention are described with reference to the following drawings, in which.

DETAILED DESCRIPTION

Figure 1:
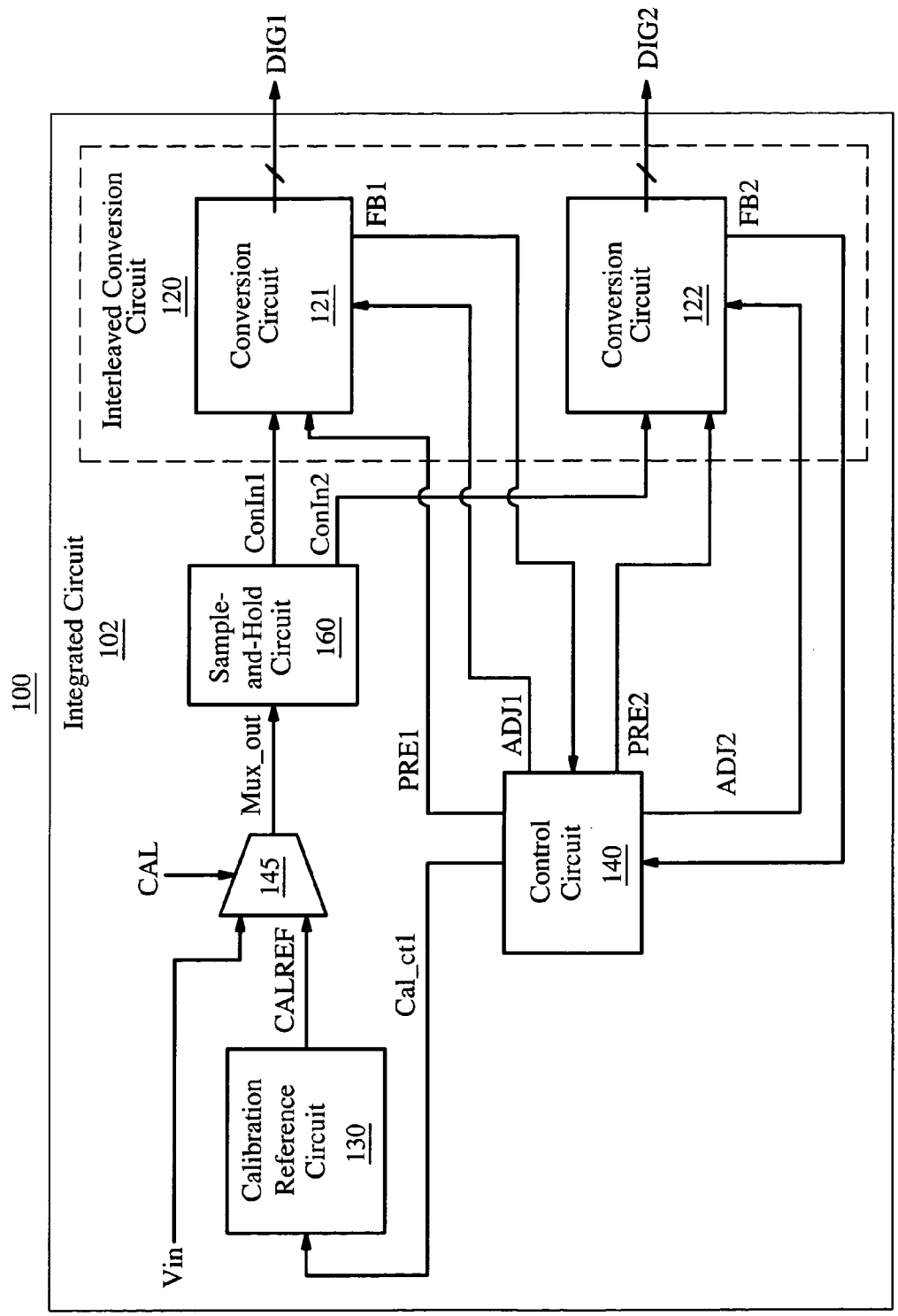
FIG. 1 shows a block diagram of an embodiment of an ADC circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Flash and folding ADCs may be scaled to very high conversion speeds, since they do not use decision feed-back loops. These two architectures can be sensitive to device mismatch, leading to linearity degradation. This is especially true of CMOS folding ADCs, since CMOS devices have larger offsets than bipolar devices. Calibration may be employed to correct these offsets.

Calibration may be used with other ADC architectures, most notably pipeline ADC architectures. Continuous background calibration may be used to calibrate an ADC circuit, but it is very complex. Also, an integrated circuit that includes an ADC circuit may receive a calibration signal and control applied externally to the integrated circuit, as a system solution. According to one embodiment of the invention, a flash or folding ADC circuit on an integrated circuit is self-calibrated with a relatively large, precise calibration resistor ladder that is also on the integrated circuit. In one embodiment, the ADC circuit includes a flash resistor ladder which is relatively small and fast, but not highly precise. However, in this embodiment, the speed of the flash resistor ladder combined with the accuracy of the calibration resistor ladder can be substantially achieved by employing the calibration resistor ladder to calibrate the ADC circuit during a calibration phase.

Briefly stated, the invention is related to an ADC circuit that includes a multiplexer, a calibration circuit, one or more ADC banks, and a calibration resistor ladder, all on an integrated circuit. The calibration resistor ladder is enabled during a calibration phase, and disabled during normal operation. When enabled, the calibration resistor ladder provides a calibration reference signal. Also, the multiplexer provides the calibration reference signal to one or more ADC banks during a calibration phase, and provides an analog input signal to the ADC banks otherwise. The calibration circuit is arranged to provide one or more adjustment signals to the ADC banks to calibrate the ADC banks in response to one or more comparator output signals from the ADC banks.

FIG. 1 shows a block diagram of an embodiment of ADC circuit 100. ADC circuit 100 includes integrated circuit 102. Integrated circuit 102 includes calibration reference circuit 130, multiplexer circuit 145, sample-and-hold circuit 160, control circuit 140, and conversion circuit 120. In one embodiment, as shown in FIG. 1, conversion circuit 120 is an interleaved conversion circuit. In an embodiment in which conversion circuit 120 is an interleaved conversion circuit, conversion circuit 120 may include conversion circuit 121 and conversion circuit 122.

Calibration signal CAL is asserted during calibration, and is not asserted during normal operation. In one embodiment, circuit ADC 100 is calibrated at power-on, and is also calibrated if the signal level at a calibration node (pin) is reversed, e.g., changing the voltage at the pin from low to high or high to low. In another embodiment, the calibration of ADC circuit 100 may be performed at periodic intervals. In yet another embodiment, the calibration of circuit 100 may be performed continuously in the background.

In one embodiment, calibration reference circuit 130 is enabled during calibration, and disabled otherwise. If disabled, calibration reference circuit 130 consumes substantially no power. If enabled, calibration reference circuit 130 is configured to provide calibration reference signal CALREF.

Moreover, calibration reference circuit 130 may include a bandgap reference and a calibration resistor ladder (not shown) that are arranged to provide a plurality of precisely spaced voltages. The calibration resistor ladder may include a plurality of precisely matched resistors. In one embodiment, Kelvin tapping is employed to provide the plurality of precisely spaced voltages from the calibration resistor ladder. Further, calibration reference circuit 130 is arranged to select one of the precisely spaced voltages as signal CALREF in response to calibration control signal Cal_ctl. In one embodiment, calibration reference circuit 130 includes CMOS switches for selecting signal CALREF.

Multiplexer circuit 145 is configured to provide signal Mux_out as follows. If signal CAL is asserted, signal Mux_out corresponds to signal CALREF. If signal CAL is not asserted, signal Mux_out corresponds to analog input signal VIN.

Also, sample-and-hold circuit 160 may be configured to sample-and-hold signal Mux_out to provide signals ConIn1 and ConIn2. In one embodiment, track-and-hold circuit 160 is a switched capacitor circuit, and the like.

Conversion circuit 120 is configured to provide a digital output signal (e.g. DIG1 and DIG2) during normal operation of ADC circuit 130. In one embodiment, conversion circuit 120 is interleaved, and the digital output signal includes signal DIG1 at a first time, and includes signal DIG2 at a second time. By interleaving conversion circuit 120 by N, conversion circuit 120 may perform analog-to-digital conversion approximately N times as fast.

In an embodiment in which conversion circuit 120 includes conversion circuits 121 and 122, conversion circuit 120 is arranged to operate as follows. During normal operation, conversion circuit 121 is configured to provide digital output signal DIG1 from signal ConIn1, and conversion circuit 122 is configured to provide digital output signal DIG2 from signal ConIn2. During calibration, conversion circuit 121 is configured to provide feedback signal FB1 from signal ConIn1, and conversion circuit 122 is configured to provide signal feedback FB2 from signal ConIn2. In one embodiment, feedback signal FB1 includes a plurality of comparator output signals, and feedback signal FB2 includes another plurality of comparator output signals.

Additionally, control circuit 140 may be a digital circuit that is configured to control calibration of ADC circuit 100. Control circuit 140 is configured to provide signal Cal_ctl. In one embodiment, control circuit 140 is configured to provide signal Cal_ctl such that calibration reference circuit 130 provides each of the precisely spaced voltages in turn, a number of times.

Also, control circuit 140 is configured to provide signal ADJ1 in response to signal FB1 during the calibration phase. During normal operation, signal ADJ1 may remain substantially the same. Signal ADJ1 may be a current, a voltage, a digital signal, and the like. In an embodiment in which conversion circuit 120 includes conversion circuit 122, control circuit 140 is further configured to provide signal ADJ2 in response to signal FB2 during the calibration phase. In one embodiment, conversion circuit 121 is arranged such that an offset voltage that is associated with conversion circuit 121 is adjusted in response to signal ADJ1, and conversion circuit 122 is arranged such that an offset voltage that is associated with conversion circuit 122 is adjusted.

Calibration of conversion circuit 120 is performed automatically; the user need not supply any signal during the calibration.

In one embodiment, signal ADJ1 includes an adjustment current that is applied to one or more loads in conversion circuit 121 to adjust a voltage. In another embodiment, signal ADJ1 includes an adjustment voltage that is arranged to provide adjust one or more of the voltages within conversion circuit 121. In yet another embodiment, signal ADJ1 includes a digital signal that is employed to control one or more switches within conversion circuit 121.

In one embodiment, a pre-calibration phase occurs prior to the calibration phase. In this embodiment, control circuit 140 may be configured to provide pre-calibration adjustment signal PRE1 in response to signal FB1 during the pre-calibration phase. During normal operation, signal PRE1 may remain substantially the same. Similarly, in this embodiment, control circuit 140 may be configured to provide pre-calibration adjustment signal PRE2 in response to signal FB2 during the pre-calibration phase.

Although conversion circuit 120 is shown as an interleaved conversion circuit in FIG. 1, embodiments in which conversion circuit 120 is not interleaved are within the spirit and scope of the invention. In these embodiments, signals ADJ2, PRE2, FB2, and DIG2 are not provided.

Figure 2:
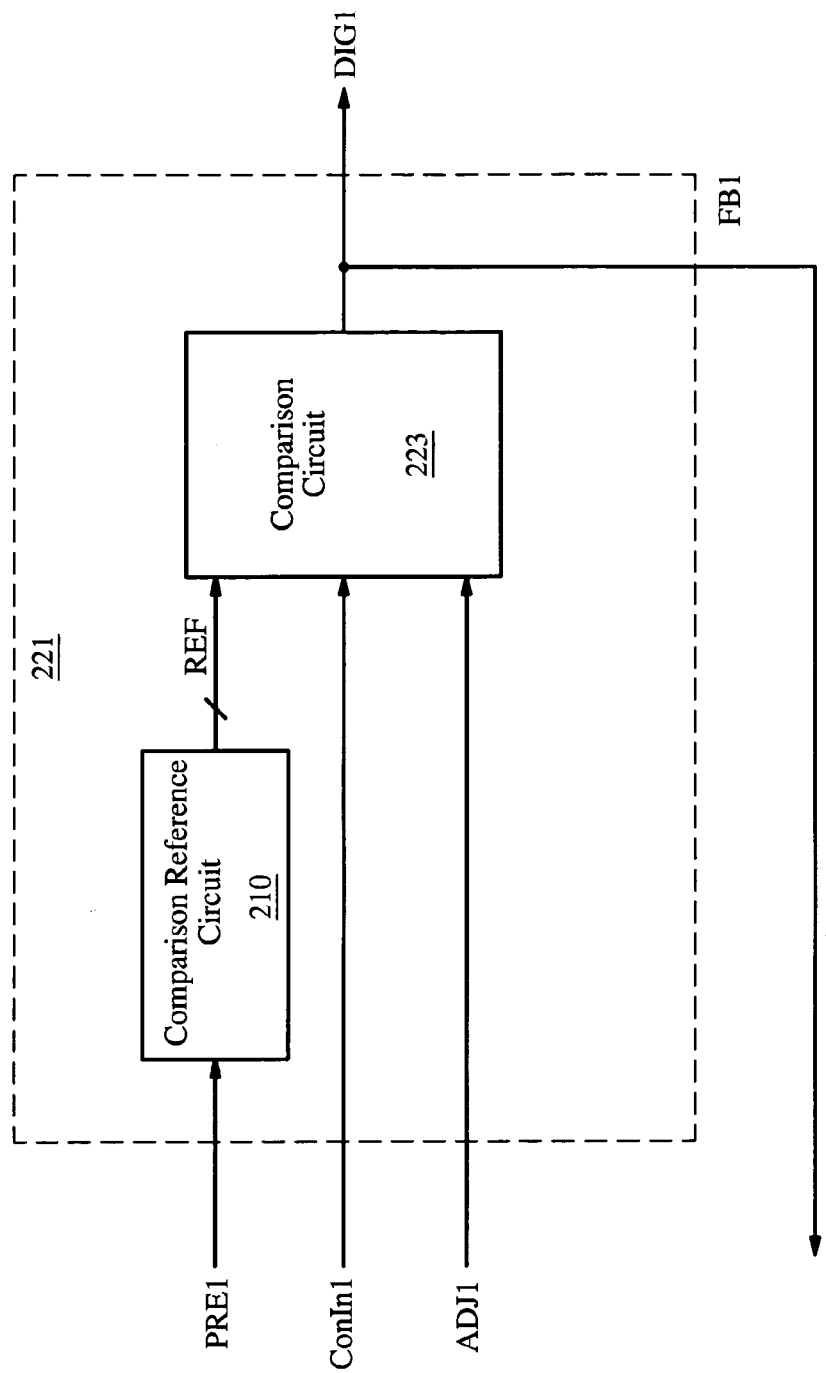
FIG. 2 illustrates a block diagram of an embodiment of a conversion circuit from FIG. 1, where the ADC circuit is a flash ADC circuit.

Similarly, although signals PRE1 and PRE2 are shown in FIG. 2, embodiments which do not include signals PRE1 and PRE2 are within the spirit and scope of the invention.

Also, some embodiments of ADC circuit 100 may have arrangements other than those illustrated in FIG. 1. For example, in one embodiment, sample-and-hold circuit 160 is not included in ADC circuit 100. In one embodiment, control circuit 140 is implemented as a plurality of different circuits. In another embodiment, control circuit 140 is implemented as a single circuit. Also, although conversion circuit 120 is shown as interleaved by two, in other embodiments, conversion circuit 120 may be interleaved by more than two.

FIG. 2 illustrates a block diagram of an embodiment of conversion circuit 221, for an embodiment in which ADC circuit 100 is a flash ADC circuit. Conversion circuit 221 may operate in a substantially similar manner as described with regard to conversion circuit 121 of FIG. 1, and may operate in a different manner in some ways. Conversion circuit 221 includes comparison reference circuit 210 and comparison circuit 223.

Comparison reference circuit 210 is arranged to provide signal REF, where signal REF includes a plurality of reference signals. In one embodiment, comparison reference circuit 210 includes a resistor ladder that is configured to provide signal REF in response to a current, and the current is adjustable responsive to signal PRE1. Comparison circuit 223 is configured to provide signal DIG1 from signals REF and ConIn1. In one embodiment, signal DIG1 includes a plurality of comparator output signals, and signal FB1 includes one or more of the plurality of comparator output signals. Also, comparison circuit 223 may be calibrated during a calibration phase responsive to signal ADJ1.

In one embodiment, calibration reference circuit 130 includes a relatively large, high-current, precise calibration resistor ladder, and comparison reference circuit 210 includes a comparison resistor ladder that is significantly smaller and faster than the calibration reference latter, but less precise. The speed of the comparison resistor ladder combined with the accuracy of the calibration resistor ladder can be substantially achieved by employing the calibration resistor ladder to calibrate comparison circuit 223 during a calibration phase.

Figure 3:
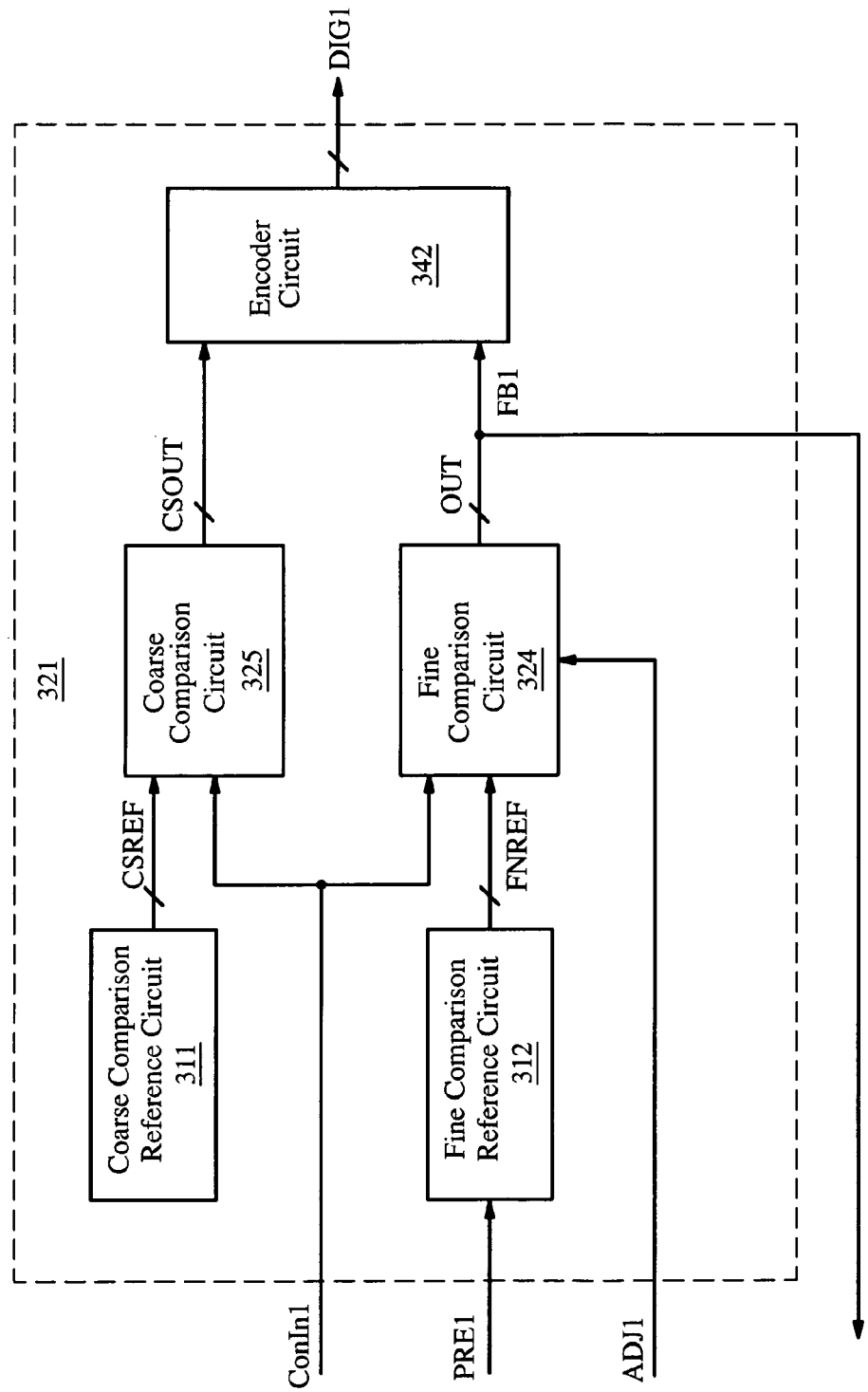
FIG. 3 shows a block diagram of another embodiment of the conversion circuit from FIG. 1, where the ADC circuit is a folding ADC circuit.

FIG. 3 illustrates a block diagram of an embodiment of conversion circuit 321, for an embodiment in which ADC circuit 100 is a folding ADC circuit. Conversion circuit 321 includes coarse comparison reference circuit 311, fine comparison circuit 324, encoder circuit 342, coarse comparison circuit 325, and fine comparison reference circuit 312. Conversion circuit 321 may operate in a substantially similar manner as conversion circuit 121 of FIG. 1, and may operate in a different manner in some ways. Similarly, fine comparison reference circuit 312 may operate in a substantially similar manner as comparison reference circuit 210 of FIG. 2, and may operate in a different manner in some ways.

Fine comparison reference circuit 312 is configured to provide signal FNREF, which includes a plurality of fine reference voltage. In one embodiment, fine comparison reference circuit 312 includes a resistor ladder that is configured to provide signal FNREF in response to a current, and the current is adjustable responsive to signal PRE1. Additionally, coarse reference circuit 311 is configured to provide signal CSREF, which includes a plurality of coarse reference voltages. The plurality of coarse voltage references are spaced corresponding to the voltage spacing between each folded region of fine comparison circuit 324.

Also, encoder circuit 342 is arranged to provide signal DIG1 from signals CSOUT and OUT. Coarse comparison circuit 325 and fine comparison circuit 324 are configured to convert, in parallel, signal ConIn1 to provide signals CSOUT and OUT, respectively. Coarse comparison circuit 325 is arranged to provide signal CSOUT from signal CSREF and ConIn1, and fine comparison circuit 324 is arranged to provide signal OUT from signals FNREF and ConIn1. In one embodiment, coarse comparison circuit 325 is a (non-folded) flash ADC. Fine comparison circuit 324 includes folding stages. Additionally, since encoder circuit 342 need not be employed during the calibration process, it may be disabled if signal CAL is not asserted, such that signal DIG1 is not provided during calibration.

In one embodiment, signal OUT includes a plurality of comparator output signals, and signal FB1 includes one or more of the plurality of comparator output signals. Fine comparison circuit 324 is arranged such that fine comparison circuit 324 is calibrated responsive to signal ADJ1.

Figure 4:
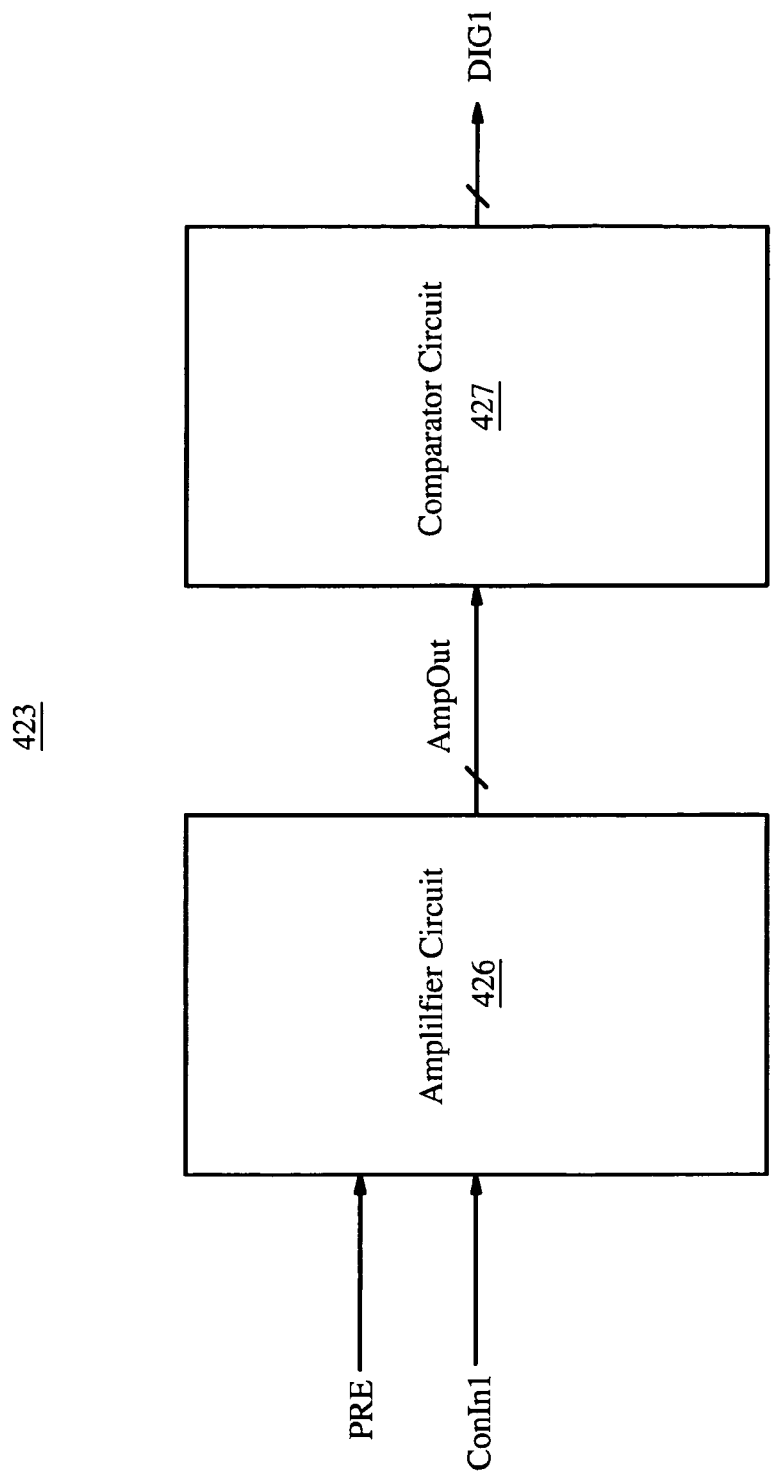
FIG. 4 illustrates a block diagram of an embodiment of a comparison circuit from FIG. 2.

FIG. 4 illustrates a block diagram of an embodiment of comparison circuit 423. Comparison circuit 423 may operate in a substantially similar manner as comparison circuit 223 of FIG. 2, and may operate in a different manner in some ways. Comparison circuit 423 includes amplifier circuit 426 and comparator circuit 427. Amplifier circuit 426 is configured to provide signal AmpOut from signals REF and ConIn1, where signal AmpOut includes a plurality of amplifier output signals. Also, comparator circuit 427 is configured to provide signal DIG1 from signal AmpOut.

Figure 5:
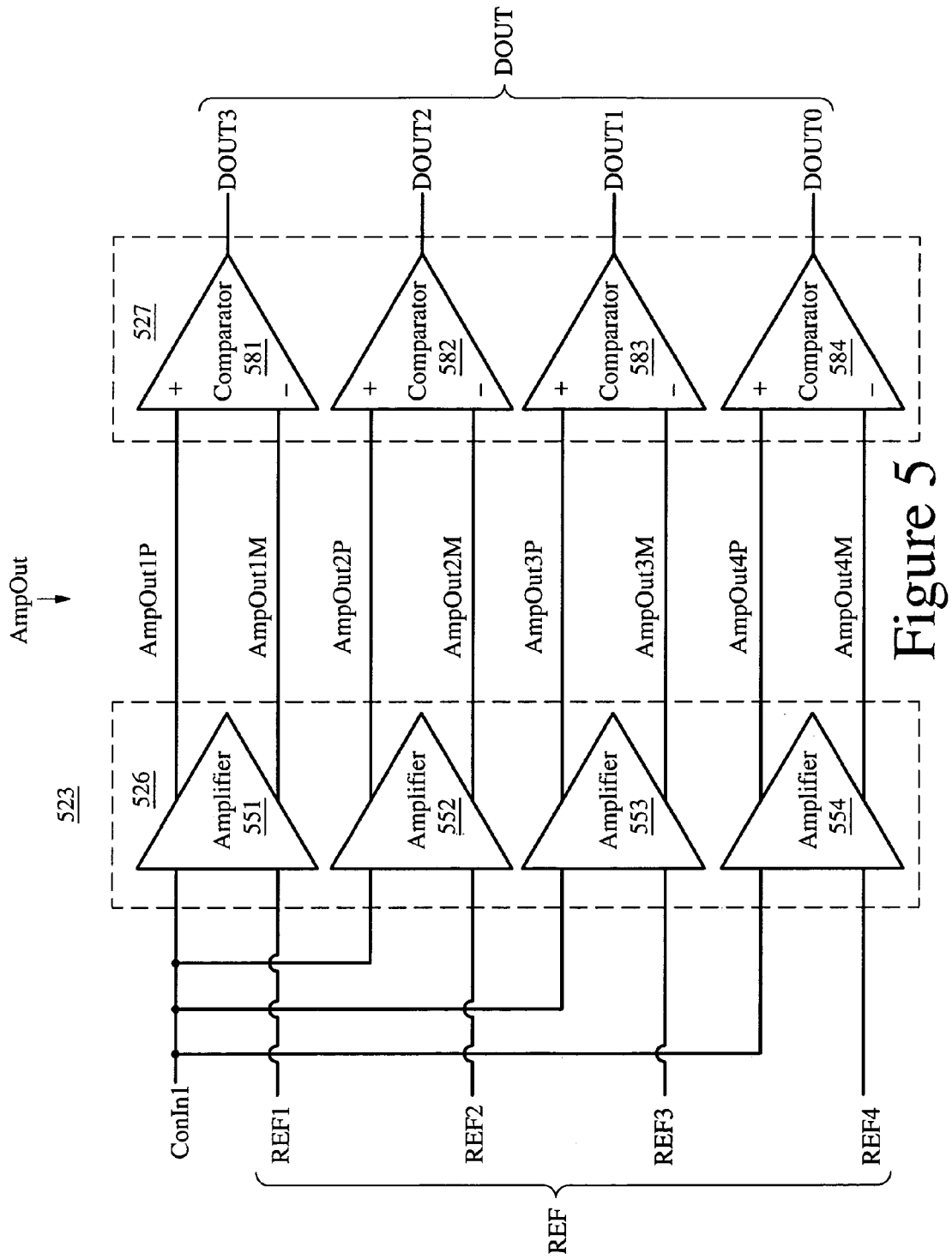
FIG. 5 shows a schematic diagram of an embodiment of a comparison circuit from FIG. 4.

FIG. 5 shows a schematic diagram of an embodiment of comparison circuit 523. Comparison circuit 523 may operate in a substantially similar manner as comparison circuit 423 of FIG. 4, and may operate in a different manner in some ways.

Amplifier circuit 526 includes a plurality of amplifiers, such as amplifiers 551–554, and comparator circuit 527 includes a plurality of comparators, such as comparators 581–584. Although four amplifiers and four comparators are shown in FIG. 4, virtually any number of amplifiers and comparators may be included in comparison circuit 523.

Amplifier 551 is configured to provide amplifier output signals AmpOut1P and AmpOut1M from signals ConIn1 and REF1, amplifier circuit 552 is configured to provide amplifier output signals AmpOut2P and AmpOut2M from signals ConIn1 and Ref2, etc. In the embodiment illustrated in FIG. 5, comparator 581 is configured to provide comparator output signal DOUT3 from signals AmpOut1P and AmpOut1M, comparator 582 is configured to provide comparator output signal DOUT2 from signals AmpOut2P and ApOut2M, etc.

In one embodiment, signals ConIn1 and REF1–REFN are single-ended signals. In other embodiments, signals ConIn1 and REF1–REFN may be differential signals.

In one embodiment, control circuit 140 (referring to FIG. 1) is configured to provide signal Cal_ctl such that signal CALREF corresponds to, in turn, the zero-crossings associated with each of the comparators in comparator circuit 527. In this embodiment, signal FB1 corresponds to the comparator output signal that corresponds to the zero-crossing. If the corresponding comparator output signal is high, a value that is associated with signal ADJ1 is decreased, where the value may be a voltage that is associated with signal ADJ1, a current that is associated with signal ADJ1, a digital value that is associated with signal ADJ1, and the like. If the corresponding comparator output signal is low, a value that is associated with signal ADJ2 is increased. At the first pass through each of the calibration reference voltages, the adjustment (increase or decrease) in the value is relatively large. At subsequent passes through each of the calibration reference voltages, the adjustments become smaller, until eventually the adjustments are relatively small. When the adjustments are relatively small, a number of passes through each of the calibration reference voltage may be made, with the adjustment being based on an average of each result, rather than being based on only one result. Making the adjustment based on an average result, rather than a single result, may reduce the effects of noise on the comparator output signals.

Although an embodiment in which one comparator output signal at a time is employed is described above, in other embodiments, more than one comparator output signal may be employed to determine the associated value for signal ADJ1.

Figure 6:
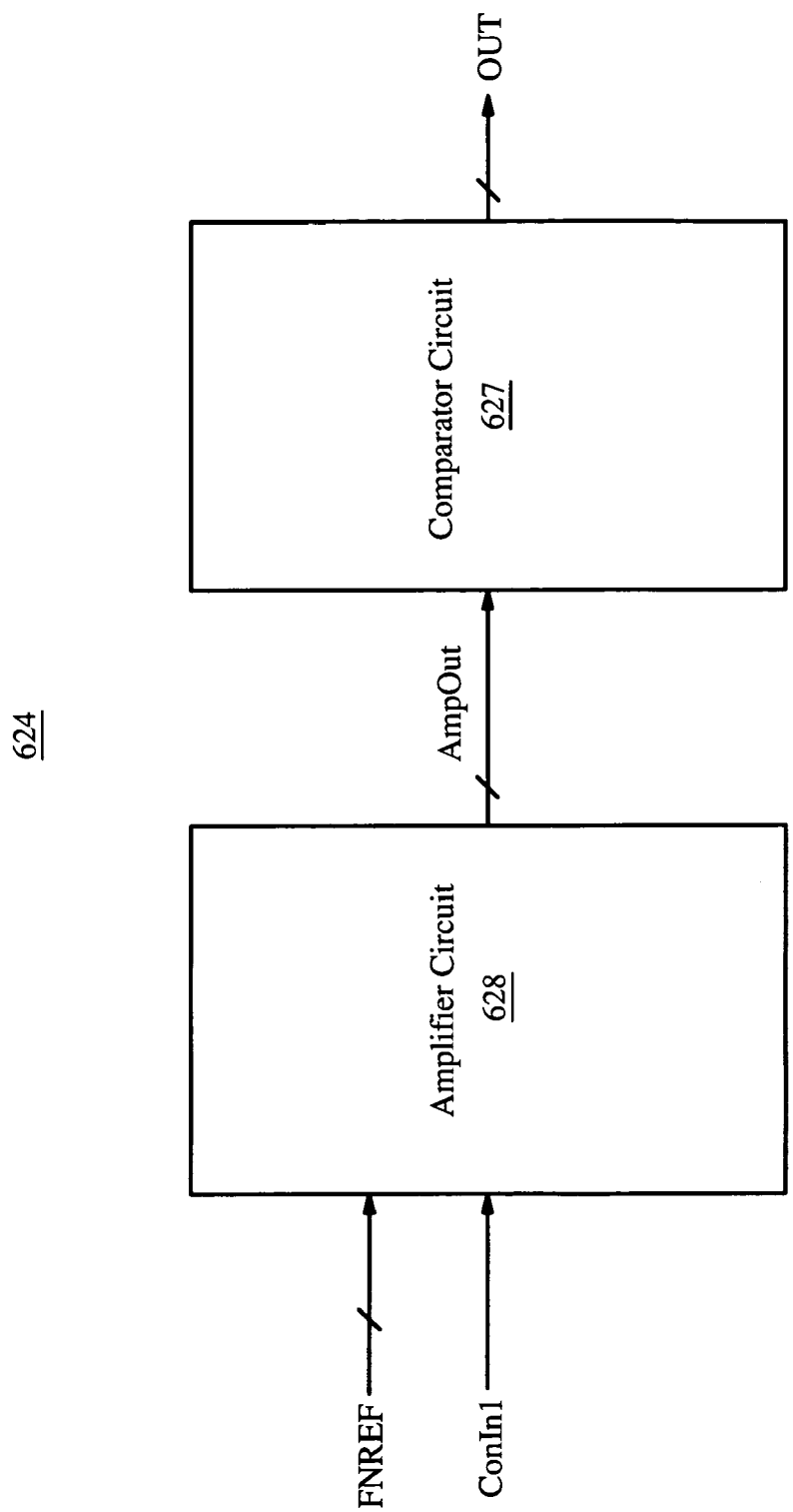
FIG. 6 illustrates a block diagram of an embodiment of a fine comparison circuit from FIG. 3.

FIG. 6 illustrates a block diagram of an embodiment of fine comparison circuit 624. Fine comparison circuit 624 includes amplifier circuit 628 and comparator circuit 627.

Fine comparison circuit 624 may operate in a substantially similar manner as described with regard to fine comparison circuit 324 of FIG. 3, and may operate in a different manner in some ways. Similarly, comparator circuit 627 may operate in a substantially similar manner as described with regard to comparator circuit 527 of FIG. 5, and may operate in a different manner in some ways.

Amplifier circuit 628 is configured to provide signal AmpOut from signals FNREF and ConIn1, where signal AmpOut includes a plurality of amplifier output signals. Comparator circuit 627 is configured to provide signal Out from signal AmpOut.

Figure 7:
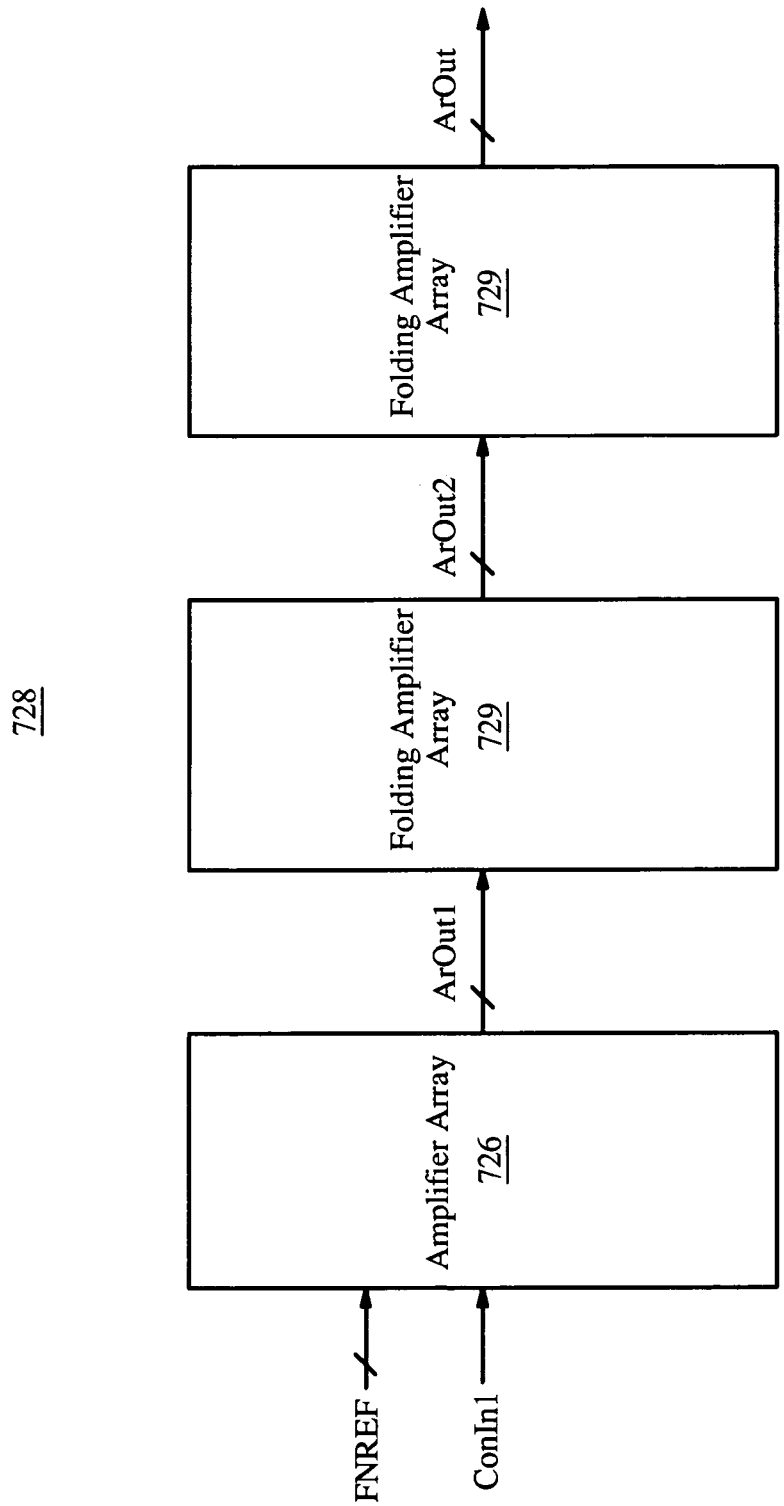
FIG. 7 shows a block diagram of an embodiment of an amplifier circuit of FIG. 6.

FIG. 7 shows a block diagram of an embodiment of amplifier circuit 728. Amplifier circuit 728 may operate in a substantially similar manner as described with regard to amplifier circuit 628 of FIG. 6, and may operate in a different manner in some ways. Amplifier circuit 728 may include amplifier array 726 and one or more folding amplifier arrays 729.

Amplifier array 726 is configured to provide signal ArOut1 from signals FNREF and ConIn1. A first folding amplifier array 729 is configured to provide signal ArOut2 from signal ArOut1. Additionally, a second folding amplifier array 729 may be configured to provide signal AmpOut from signal ArOut2. Although three amplifier arrays are illustrated in FIG. 7, amplifier circuit 728 may include more or less amplifier arrays than shown.

If Y/Z is a multiple of F, where Y is the number of differential pairs in amplifier array 726, Z is the number of differential pairs in folding amplifier array 729, and F is the order of folding in folding amplifier array 729, then the zero-crossings of the amplifiers in amplifier array 726 are folded onto the zero-crossings of the analog-to-digital conversion. Accordingly, Y/(Z*F) comparator output signals may be used in signal FB to calibrate the zero-crossing for every amplifier in amplifier array 726. If Y/Z=X, a single comparator output signal may be used by control circuit 140 (referring to FIG. 1) to calibrate the zero-crossing for every amplifier in amplifier circuit 726.

Figure 8:
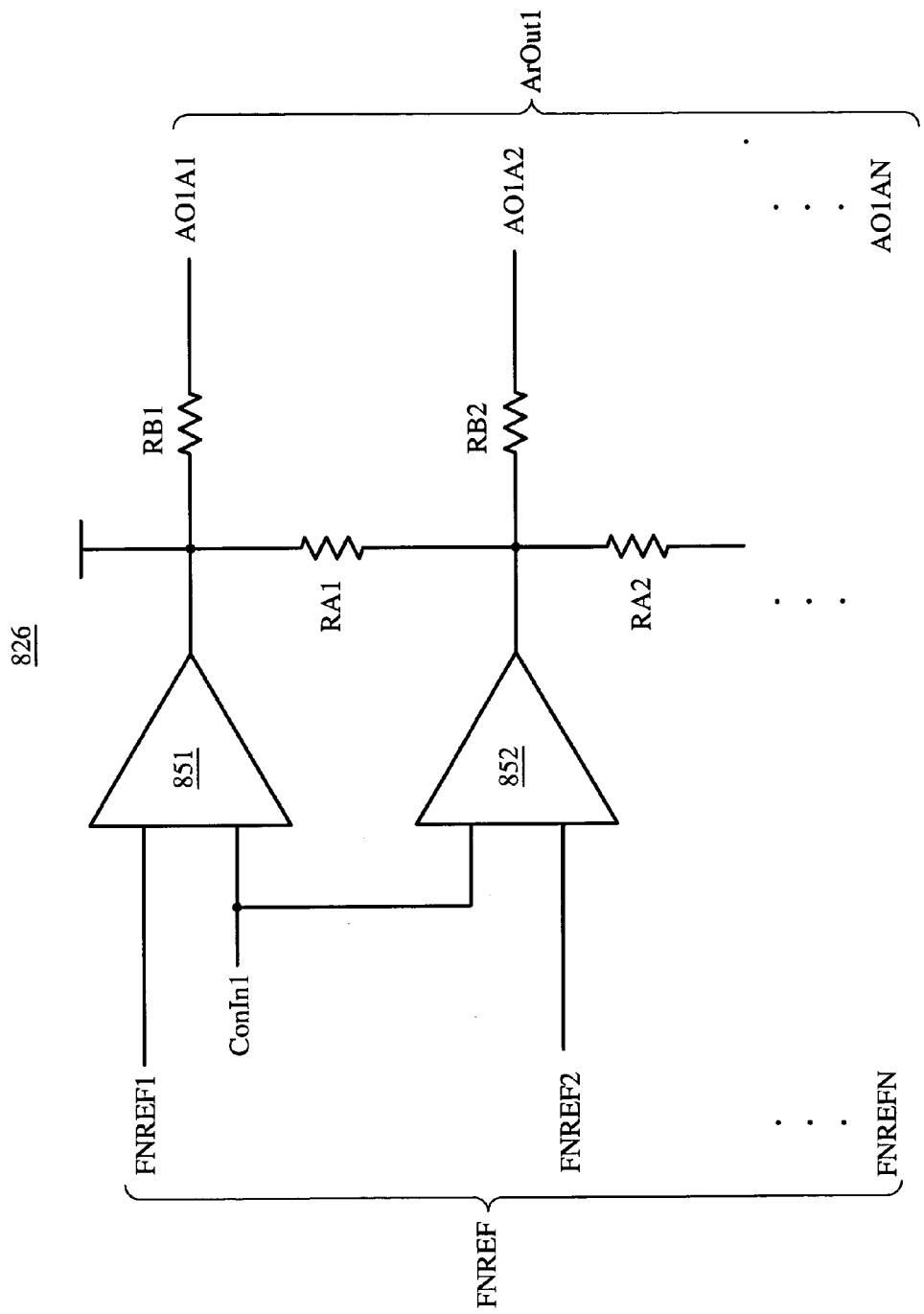
FIG. 8 schematically illustrates an embodiment of an amplifier array from FIG. 7.

FIG. 8 schematically illustrates an embodiment of an amplifier array 826. Amplifier array 826 may operate in a substantially similar manner as described with regard to amplifier array 726, and may operate differently in some ways. Amplifier array 826 may include amplifiers 851, 852, and so on, resistor circuits RA1, RA2, and so on, and resistor circuits RB1, RB2, and so on. However, the resistor circuits illustrated in FIG. 8 are optional components that need not be included in amplifier array 826. As shown in FIG. 8, signal FNREF includes signal FNREF1–FNREFN, and signal ArOut1 includes signals AO1A1–AO1AN.

In one embodiment, signals ConIn1, FNREF1–FNREFN and AO1A1–AO1AN are single-ended signals. In other embodiments, signals ConIn1, FNREF1–FNREFN and AO1A1–AO1AN may be differential signals. Each of the amplifier in amplifier array 826 includes a differential pair.

Figure 9:
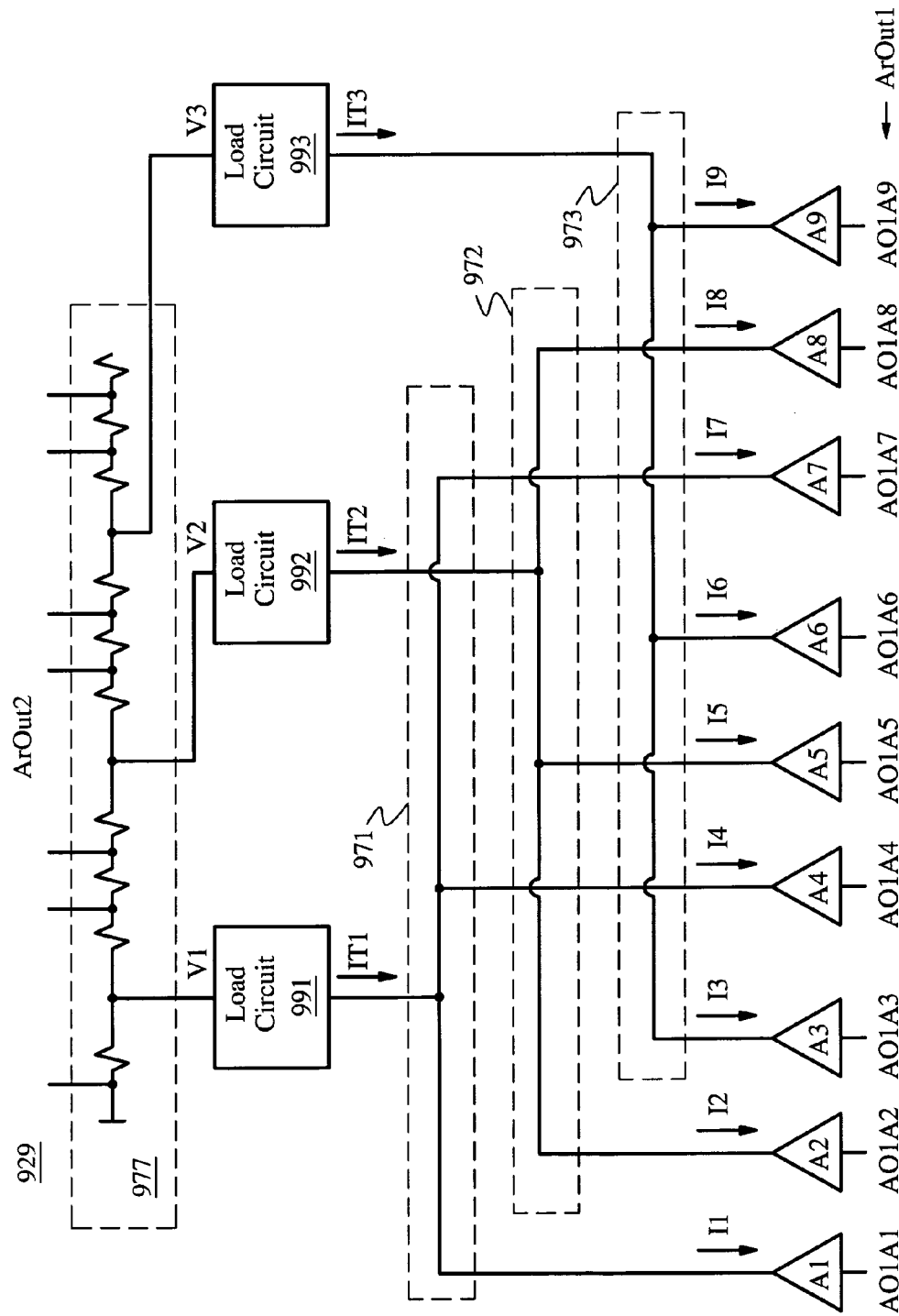
FIG. 9 shows a block diagram of an embodiment of a folding amplifier array from FIG. 8.

FIG. 9 shows a block diagram of an embodiment of folding amplifier array 929. Folding amplifier array 929 may operate in a substantially similar manner as described with regard to folding amplifier array 729 of FIG. 7, and may operate in a different manner in some ways. Folding amplifier array 929 may include output transconductance amplifiers (OTAs) A1–A9, folding buses 971–973, load circuits 991–993, and interpolation resistor circuit 977. Each of the OTAs A1–A9 includes a differential pair and a tail current source (not shown).

OTAs A1–A9 are configured to provide currents I1–I9 in response to signals AO1A1–AO1A9, respectively. Also, folding bus 971 is arranged to combine currents I1, I4, and I7 into current IT1, folding bus 972 is arranged to combine currents I2, I5, and I8 into current IT2, and folding bus 973 is arranged to combine currents I3, I6, and I9 into current IT3. In one embodiment, as shown in FIG. 9, currents I1–I9 and IT1–IT3 are sink currents. In another embodiment, currents I1–I9 and IT1–IT3 are source currents.

Also, load circuits 991–993 are configured to provide voltages V1–V3 from currents IT1–IT3 respectively. Interpolation resistor circuit 977 is arranged to provide signal ArOut2 from voltages V1–V3.

In one embodiment, signals AO1A1–AO1AN, I1–I9, IT1–I3, and V1–V3 are single-ended signals. In other embodiments, signals AO1A1–AO1AN, I1–I9, IT1–I3, and V1–V3 may be differential signals.

Signal ADJ1 may be provided in a variety of differently places in conversion circuit 120, referring to FIG. 1. In one embodiment, signal ADJ1 is an adjustment current that is applied to one or more of the resistor circuits in amplifier array 826 of FIG. 8. In another embodiment, signal ADJ1 is an adjustment current that is applied to one or more of the resistor circuits in folding amplifier array 929 of FIG. 9. In another embodiment, signal ADJ1 is a voltage, current, or digital signal that is arranged to adjust one or more of the load circuits 991–993 of amplifier array 929 of FIG. 9. In another embodiment, signal ADJ1 is a current, voltage, or digital signal that is arranged to adjust the differential pairs in one or more of the OTAs A1–A9 in amplifier array 929 of FIG. 9. In another embodiment, signal ADJ1 is arranged to be received by one or more resistors in amplifier circuit 526 or comparator circuit 527 of FIG. 527. In another embodiment, signal ADJ1 is arranged to be received by one or more resistors in comparator circuit 627 of FIG. 6. In another embodiment, signal ADJ1 is arranged to adjust the spacing of the voltage taps in comparison reference circuit 210 of FIG. 2. In another embodiment, signal ADJ1 is arranged to adjust the spacing of the voltage taps in fine comparison circuit 312 of FIG. 3. These and other arrangements for adjusting comparison circuit 120 in response to signal ADJ1 are within the spirit and scope of the invention.

In one embodiment in which signal ADJ1 includes an adjustment current that is received by a resistor circuit, the adjustment current may be provided by control circuit 1040 such that the adjustment circuit is substantially inversely proportional to a resistance that is associated with the resistor circuit. This way, a voltage adjustment provided by the adjustment current is substantially independent of temperature.

Figure 10:
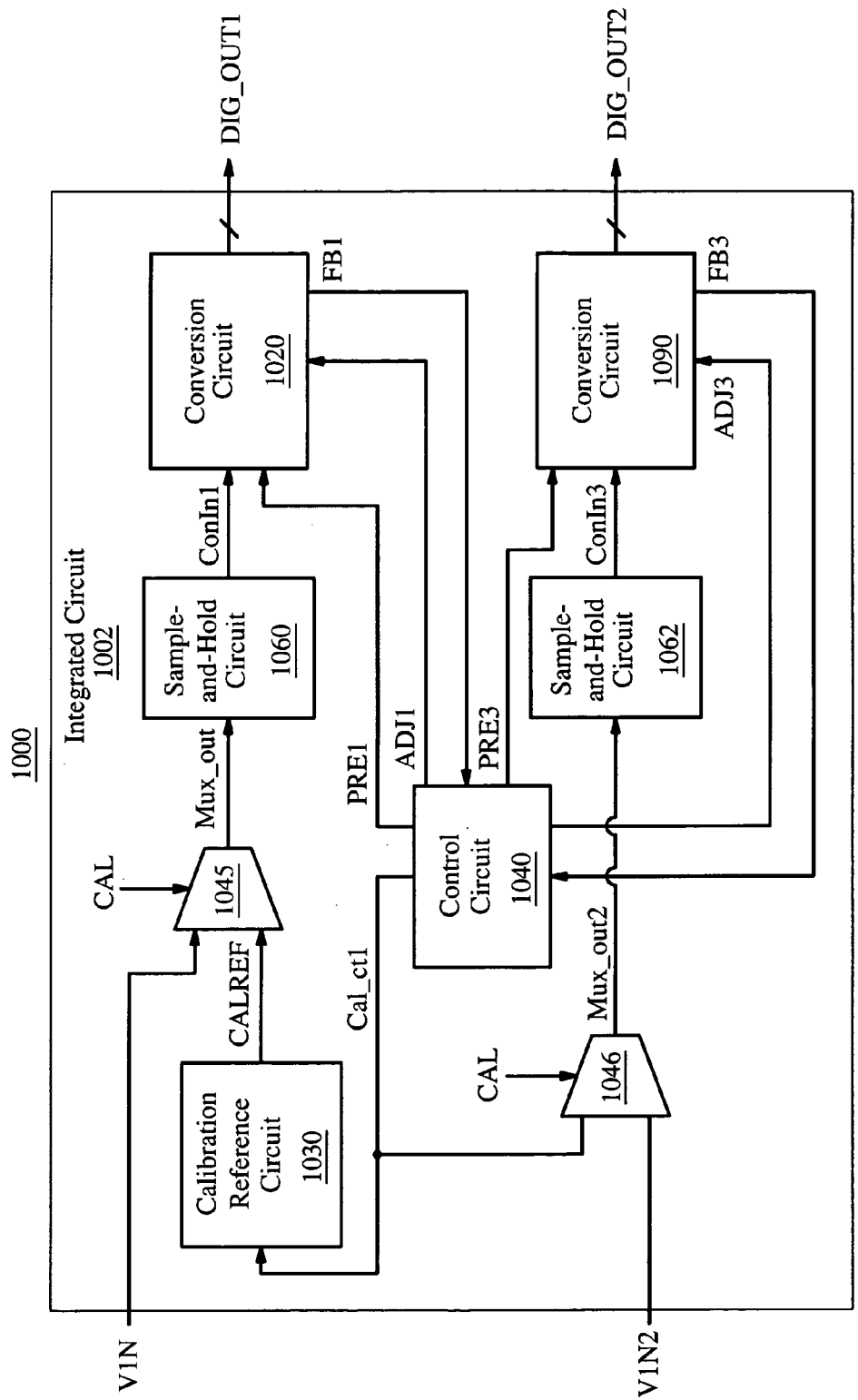
FIG. 10 illustrates a block diagram of another embodiment of an ADC circuit, arranged in accordance with aspects of the present invention.

FIG. 10 illustrates a block diagram of an embodiment of ADC circuit 1000. ADC circuit 1000 includes multiple conversion circuits on a single chip. Though calibration, offset between multiple analog-to-digital conversions is substantially eliminated. ADC circuit 1000 includes integrated circuit 1002. Integrated circuit 1002 includes calibration reference circuit 1030, multiplexer circuits 1045 and 1046, sample-and-hold circuits 1060 and 1062, control circuit 1040, and conversion circuits 1020 and 1090. Components in ADC circuit 1000 may operate in a substantially similar manner to similarly named components in ADC circuit 100, and may operate in a different manner in some ways.

Multiplexer circuit 1045 is configured to provide signal Mux_out responsive to signals VIN, CALREF, and CAL. Similarly, multiplexer circuit 1046 is configured to provide signal Mux_out2 responsive to signals VIN2, CALREF, and CAL. Also, sample-and-hold circuit 1060 is configured to provide signal ConIn1 from signal Mux_out. Similarly, sample-and-hold circuit 1062 is configured to provide signal ConIn3 from signal Mux_out2. Conversion circuit 1020 is configured to provide signal DIG_OUT1 in response to signal ConIn1 during normal operation, and further configured to provide signal FB1. Similarly, conversion circuit 1090 is configured to provide signal DIG_OUT2 in response to signal ConIn3 during normal operation, and further configured to provide signal FB3. In one embodiment, neither conversion circuit 1020 or conversion circuit 1090 are interleaved. In another embodiment, one or both of conversion circuits 1020 and 1090 are interleaved.

Control circuit 1040 is configured to provide signal Cal_ctl. Also, control circuit 1040 is configured to, during the calibration phase, provide signal ADJ1 in response to signal FB1, and provide signal ADJ3 in response to signal FB3. In one embodiment, control circuit 1040 is further configured to, during a pre-calibration phase, provide signal PRE1 in response to signal FB1 and to provide signal PRE3 in response to signal FB3.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for analog-to-digital conversion, comprising:
   a calibration reference circuit that is configured to provide a calibration reference signal, wherein the calibration reference circuit is included within an integrated circuit; and
   a conversion circuit that is included within the integrated circuit, wherein the conversion circuit includes:
   a comparison reference circuit that is configured to provide a plurality of references signals; and
   a comparison circuit that is configured to provide a plurality of comparator output signals in response to the plurality of reference signals and a comparison input signal, wherein the comparison input signal is generated from the calibration reference signal if a calibration signal is asserted, wherein the calibration reference circuit is arranged such that:
   if the calibration signal is asserted, the calibration reference circuit is enabled; and
   if the calibration signal is unasserted, the calibration reference circuit is disabled such that the calibration reference circuit consumes substantially no power.

2. A circuit for analog-to-digital conversion, comprising:
   a calibration reference circuit that is configured to provide a calibration reference signal, wherein the calibration reference circuit is included within an integrated circuit; and
   a conversion circuit that is included within the integrated circuit, wherein the conversion circuit includes:
   a comparison reference circuit that is configured to provide a plurality of references signals; and
   a comparison circuit that is configured to provide a plurality of comparator output signals in response to the plurality of reference signals and a comparison input signal, wherein the comparison input signal is generated from the calibration reference signal if a calibration signal is asserted, wherein the calibration reference circuit includes a first resistor ladder, the comparison reference circuit includes a second resistor ladder, and wherein the first resistor ladder is significantly larger than the second resistor ladder.

3. A circuit for analog-to-digital conversion, comprising:
   a calibration reference circuit that is configured to provide a calibration reference signal, wherein the calibration reference circuit is included within an integrated circuit; and
   a conversion circuit that is included within the integrated circuit, wherein the conversion circuit includes:
   a comparison reference circuit that is configured to provide a plurality of references signals; and
   a comparison circuit that is configured to provide a plurality of comparator output signals in response to the plurality of reference signals and a comparison input signal, wherein the comparison input signal is generated from the calibration reference signal if a calibration signal is asserted, wherein the calibration reference circuit includes a resistor ladder, and wherein the resistor ladder is arranged to provide the calibration reference signal such that the calibration reference signal includes one of a plurality of precisely spaced voltages that is selected in response to a calibration reference control signal.

4. A circuit for analog-to-digital conversion, comprising:
   a calibration reference circuit that is configured to provide a calibration reference signal, wherein the calibration reference circuit is included within an integrated circuit; and
   a conversion circuit that is included within the integrated circuit, wherein the conversion circuit includes:
   a comparison reference circuit that is configured to provide a plurality of references signals; and
   a comparison circuit that is configured to provide a plurality of comparator output signals in response to the plurality of reference signals and a comparison input signal, wherein the comparison input signal is generated from the calibration reference signal if a calibration signal is asserted, wherein the comparison circuit includes:
   an amplifier circuit comprising a plurality of amplifiers, wherein the amplifier circuit is configured to provide a plurality of amplifier output signals in response to the plurality of reference signals and the comparison input signal; and
   a comparator circuit comprising a plurality of comparators, wherein the comparator circuit is configured to provide the plurality of comparator output signals in response to the plurality of amplifier output signals.

5. The circuit of claim 4, further comprising:
   a calibration control circuit, wherein the calibration control circuit is a digital circuit that is arranged to provide an adjustment signal in response to a quantity X of the plurality of comparator output signals,
   wherein the amplifier circuit includes a first amplifier array including Y differential pairs and the amplifier circuit further includes a second amplifier array including Z differential pairs, the second amplifier array is folded according to an order of folding F, Y/Z is a multiple of F, and wherein $X=Y/(F*Z)$.

6. The circuit of claim 4, further comprising:
   a calibration control circuit, wherein the calibration control circuit is a digital circuit that is arranged to receive at least one of the plurality of comparator output signals provide an adjustment signal in response to the at least one of the plurality of comparator output signals, and wherein the comparison control circuit further includes:
   a coarse reference circuit that is arranged to provide a plurality of coarse reference voltages;

a coarse reference circuit that is arranged to provide a coarse channel output signal from the plurality of coarse reference voltages and the comparison input signal; and a decoder circuit that is arranged to provide a digital output signal from the coarse channel output signal and the plurality of comparator output voltages.

7. The circuit of claim 4, further comprising:

a calibration control circuit, wherein the calibration control circuit is a digital circuit that is arranged to receive one of the plurality of comparator output signals, the amplifier circuit includes a plurality of input stages, and wherein the calibration control circuit is arranged to, for each of the input stages in the amplifier circuit, calibrate a zero-crossing that is associated with the input stage in response to the one of the plurality of comparator output signals.

8. A circuit for analog-to-digital conversion, comprising:

a calibration reference circuit that is configured to provide a calibration reference signal, wherein the calibration reference circuit is included within an integrated circuit; and a conversion circuit that is included within the integrated circuit, wherein the conversion circuit includes:

a comparison reference circuit that is configured to provide a plurality of references signals;

a comparison circuit that is configured to provide a plurality of comparator output signals in response to the plurality of reference signals and a comparison input signal, wherein the comparison input signal is generated from the calibration reference signal if a calibration signal is asserted; and a multiplexer circuit that is included within the integrated circuit, wherein the multiplexer circuit is configured to provide a multiplexer output signal that corresponds to:

if a calibration signal is asserted, the calibration reference signal; and if the calibration signal is unasserted, an analog input signal, wherein the first comparison input signal is generated from the multiplexer output signal.

9. The circuit of claim 8, further comprising:

a sample-and-hold circuit that is configured to generate the comparison input signal from the multiplexer output signal.

10. A circuit for analog-to-digital conversion, comprising:

a calibration reference circuit that is configured to provide a calibration reference signal, wherein the calibration reference circuit is included within an integrated circuit; and a conversion circuit that is included within the integrated circuit, wherein the conversion circuit includes:

a comparison reference circuit that is configured to provide a plurality of references signals;

a comparison circuit that is configured to provide a plurality of comparator output signals in response to the plurality of reference signals and a comparison input signal, wherein the comparison input signal is generated from the calibration reference signal if a calibration signal is asserted; and a calibration circuit that is configured to provide an adjustment signal in response to a feedback signal that includes at least one of the plurality of comparator output signals, wherein the comparison circuit is arranged to receive the adjustment signal, and wherein the comparison circuit is further arranged such that an offset voltage is adjusted in response to the adjustment signal.

11. The circuit of claim 10, wherein the adjustment signal includes an adjustment current, the conversion circuit includes a resistor circuit, the conversion circuit is arranged such that the adjustment current is provided to the resistor, and wherein the calibration circuit is configured to provide the adjustment current such that the adjustment current is substantially inversely proportional to a resistance that is associated with the resistor circuit.

12. The circuit of claim 10, wherein the calibration control signal is asserted during a calibration phase and during a pre-calibration phase, the calibration circuit is configured to provide the control signal during the calibration phase, the calibration circuit is further configured to provide another adjustment signal in response to the feedback signal during a pre-calibration phase, the comparison reference circuit includes a resistor ladder that is configured to provide the plurality of reference signals in response to a current, and wherein the resistor ladder is arranged such that the current is adjustable responsive to the other control signal.

13. A circuit for analog-to-digital conversion, comprising:

a calibration reference circuit that is configured to provide a calibration reference signal, wherein the calibration reference circuit is included within an integrated circuit; and a conversion circuit that is included within the integrated circuit, wherein the conversion circuit includes:

a comparison reference circuit that is configured to provide a plurality of references signals;

a comparison circuit that is configured to provide a plurality of comparator output signals in response to the plurality of reference signals and a comparison input signal, wherein the comparison input signal is generated from the calibration reference signal if a calibration signal is asserted; and another conversion circuit that is included within the integrated circuit, wherein the other conversion circuit includes:

another comparison reference circuit that is configured to provide another plurality of references signals; and another comparison circuit that is configured to provide another plurality of comparator output signals in response to the other plurality of reference signals and another comparison input signal, wherein the other comparison input signal is generated from the calibration reference signal if the calibration signal is asserted.

14. The circuit of claim 13, further comprising:

a calibration circuit that is configured to provide an adjustment signal in response to a feedback signal that includes at least one of the plurality of comparator output signals, and further configured to provide another adjustment signal in response to another feedback signal that includes at least one of the other plurality of comparator output signals, wherein the comparison circuit is arranged to receive the adjustment signal and to adjust an offset voltage in response to the adjustment signal, and wherein the other comparison circuit is arranged to receive the other adjustment signal, and to adjust another offset voltage in response to the other adjustment signal.

15. A circuit for analog-to-digital conversion, comprising:

a calibration reference circuit that is configured to provide a calibration reference signal, wherein the calibration reference circuit is included within an integrated circuit; and a conversion circuit that is included within the integrated circuit, wherein the conversion circuit includes:

a comparison reference circuit that is configured to provide a plurality of references signals; and a comparison circuit that is configured to provide a plurality of comparator output signals in response to the plurality of reference signals and a comparison input signal, wherein the comparison input signal is generated from the calibration reference signal if a calibration signal is asserted, wherein the calibration reference circuit is arranged to generate a plurality of calibration reference voltages, and further arranged such that one of the plurality of calibration reference voltages is selected as the calibration reference signal in response to a calibration control signal, wherein the calibration reference circuit includes a resistor ladder, and wherein the calibration reference circuit is further arranged such that Kelvin tapping is employed to provide the plurality of calibration references from the resistor ladder.

16. A circuit for analog-to-digital conversion, comprising:

a calibration reference circuit that is configured to provide a calibration reference signal, wherein the calibration reference circuit is included within an integrated circuit; and a conversion circuit that is included within the intergrated circuit, wherein the conversion circuit includes:

a comparison reference circuit that is configured to provide a plurality of references signals;

a comparison circuit that is configured to provide a plurality of comparator output signals in response to the plurality of reference signals and a comparison input signal, wherein the comparison input signal is generated from the calibration reference signal if a calibration signal is asserted, wherein the calibration reference circuit is arranged to generate a plurality of calibration reference voltages, and further arranged such that one of the plurality of calibration reference voltages is selected as the calibration reference signal in response to a calibration control signal; and a calibration control circuit that is configured to provide the calibration control signal such that, during a first time interval, the calibration control signal provides each of the plurality of calibration reference voltages in turn, and further configured to provide an adjustment signal in response to a feedback signal that includes at least one of the plurality of comparator output signals, wherein the comparison circuit is arranged to receive the adjustment signal, and the comparison circuit is further arranged to adjust an offset voltage in response to the adjustment signal.

17. The circuit of claim 16, wherein the calibration control signal is configured to repeatedly provide each of the plurality of calibration reference voltages in turn during a later time interval, wherein the adjustment signal has an associated value, and wherein the calibration control circuit is further configured to provide the adjustment signal such that:

if the feedback signal is associated with a first logical level, the associated value is increased by an adjustment amount, wherein the adjustment amount is relatively large during the first time interval, and wherein the adjustment amount is relatively small during the later time interval; and if the feedback signal is associated with a second logic level, the associated value is decreased by the adjustment amount.

18. A circuit for analog-to-digital conversion, comprising:

a calibration reference circuit that is configured to provide a calibration reference voltage; and an interleaved conversion circuit that is interleaved such that the conversion circuit includes a plurality of conversion circuits, wherein each of the plurality of conversion circuits includes:

a comparison reference circuit that is configured to provide a plurality of reference signals; and a comparison circuit that is configured to provide a plurality of comparator output signals in response to a comparison input signal and the plurality of reference signals, wherein each of the comparison inputs signals is generated from the calibration reference signal if a calibration signal is asserted, wherein the calibration reference circuit is arranged such that:

if the calibration signal is asserted, the calibration reference circuit is enabled; and if the calibration signal is unasserted, the calibration reference circuit is disabled such that the calibration reference circuit consumes substantially no power.

19. The circuit of claim 18, further comprising:

a calibration circuit that is configured to provide a calibration control signal and a plurality of adjustment signals, wherein the calibration reference circuit is arranged to generate a plurality of calibration reference voltages, and the calibration reference circuit is further arranged such that one of the plurality of calibration reference voltages is selected as the calibration reference signal in response to a calibration control signal, each of the plurality of comparison circuits is configured to provide a feedback signal that includes at least one of the plurality of comparator output signals that is associated with the comparison circuit, each of the plurality of comparison circuits is arranged to receive a corresponding one of the plurality of adjustment signals, each of the comparison circuits is arranged such that an offset voltage that is associated with the comparison circuit is adjusted in response to the corresponding adjustment signal, and wherein the calibration circuit is configured to provide the plurality of adjustment signals such that each of the plurality of adjustment signals is provided in response to a corresponding one of the feedback signals.

20. The circuit of claim 18, further comprising a multiplexer circuit that is arranged to multiplex the calibration reference voltage with an analog input signal.

21. A circuit for analog-to-digital conversion, comprising:

a means for providing a calibration reference signal, wherein the means for providing the calibration reference signal is included within an integrated circuit; and a means for conversion that is included within the integrated circuit, wherein the means for conversion includes:

a means for providing a plurality of references signals; and a means for providing, in parallel, a plurality of comparator output signals in response to the plurality of reference signals and a comparison input signal, wherein the comparison input signal is generated from the calibration reference signal if a calibration signal is asserted, wherein:

if the calibration signal is asserted, the means for providing a calibration reference signal is enabled; and if the calibration signal is unasserted, the means for providing a calibration reference signal is disabled such that the means for providing a calibration reference signal consumes substantially no power.

22. A circuit for analog-to-digital conversion, including:
a flash or folding ADC including:
   a plurality of comparators; and
   a comparison reference circuit, wherein the comparison reference circuit is included in an integrated circuit, and wherein a calibration reference circuit is arranged such that:
     if the calibration signal is asserted, the calibration reference circuit is enabled; and
     if the calibration signal is unasserted, the calibration reference circuit is disabled such that the calibration reference circuit consumes substantially no power.

23. The circuit of claim 22,
wherein the flash or folding ADC further includes the calibration reference circuit, and
wherein if a calibration signal is unasserted, the calibration reference circuit is disabled.

24. The circuit of claim 22, wherein the flash or folding ADC further includes:
   the calibration reference circuit; and
   a multiplexer circuit having at least a first input and a second input, wherein the first input of the multiplexer circuit is coupled to calibration reference circuit, and wherein the other input of the multiplexer circuit is arranged to receive an analog input signal.

25. The circuit of claim 22, wherein the comparison reference circuit includes a resistor ladder.

26. The circuit of claim 25, wherein the flash or folding ADC further includes the calibration reference circuit, which includes another resistor ladder that is significantly larger than the resistor ladder.

* * * * *

UNITED STATES PATENT AND TRADEMARK OFFICE
CERTIFICATE OF CORRECTION

| | | |
|---|---|---|
| PATENT NO. | : 7,046,179 B2 | Page 1 of 1 |
| APPLICATION NO. | : 10/817322 | |
| DATED | : May 16, 2006 | |
| INVENTOR(S) | : Robert Callaghan Taft et al. | |

It is certified that error appears in the above-identified patent and that said Letters Patent is hereby corrected as shown below:

In the Claims:

Column 6, Line 31, Delete "ApOut2M," and insert --AmpOut2M, --.

Column 13, Line 25 (Approx.) In Claim 16, delete "intergrated" and insert

-- integrated --.

Signed and Sealed this

Tenth Day of October, 2006

JON W. DUDAS
*Director of the United States Patent and Trademark Office*